US007628309B1

United States Patent
Eriksen et al.

(10) Patent No.: US 7,628,309 B1
(45) Date of Patent: Dec. 8, 2009

(54) TRANSIENT LIQUID PHASE EUTECTIC BONDING

(75) Inventors: Odd Harald Steen Eriksen, Brooklyn Park, MN (US); Shuwen Guo, Lakeville, MN (US); Kimiko Childress, Farmington, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 451 days.

(21) Appl. No.: 11/120,879

(22) Filed: May 3, 2005

(51) Int. Cl.
*B23K 20/00* (2006.01)
(52) U.S. Cl. .................. 228/194; 228/193; 228/225
(58) Field of Classification Search ............... 228/193, 228/194, 225, 226, 245–255
See application file for complete search history.

(56) References Cited

U.S. PATENT DOCUMENTS

| | | | |
|---|---|---|---|
| 3,200,490 A | 8/1965 | Clymer | |
| 3,396,454 A * | 8/1968 | Schroeder et. al. | ....... 228/180.1 |
| 3,619,742 A | 11/1971 | Rud, Jr. | |
| 3,879,746 A | 4/1975 | Fournier | |
| 3,935,986 A | 2/1976 | Lattari et al. | |
| 4,215,156 A | 7/1980 | Dalal et al. | |
| 4,233,337 A | 11/1980 | Friedman et al. | |
| 4,330,343 A | 5/1982 | Christou et al. | |
| 4,400,869 A | 8/1983 | Wilner et al. | |
| 4,505,027 A | 3/1985 | Schwabe et al. | |
| 4,545,115 A | 10/1985 | Bauer et al. | |
| 4,637,129 A | 1/1987 | Derkits, Jr. et al. | |
| 4,702,941 A * | 10/1987 | Mitchell et al. | ............. 427/250 |
| 4,722,227 A | 2/1988 | Grob et al. | |
| 4,758,534 A | 7/1988 | Derkits, Jr. et al. | |
| 4,777,826 A | 10/1988 | Rud, Jr. et al. | |

(Continued)

FOREIGN PATENT DOCUMENTS

DE 10060439 6/2002

(Continued)

OTHER PUBLICATIONS

Neppl, F. et al., "A TaSi$_x$ Barrier for Low Resistivity and High Reliability of Contacts to Shallow Diffusion Regions in Silicon," *Thin Solid Films*, 120, pp. 257-266 (1984).

(Continued)

*Primary Examiner*—Jessica L Ward
*Assistant Examiner*—Megha Mehta
(74) *Attorney, Agent, or Firm*—Thompson Hine LLP

(57) ABSTRACT

A method for bonding two components together including the steps of providing a first component, providing a second component, and locating a first eutectic bonding material between the first and second component. The first eutectic bonding material includes at least one of germanium, tin, or silicon. The method further includes the step of locating a second eutectic bonding material between the first and second component and adjacent to the first eutectic bonding material. The second eutectic bonding material includes gold. The method further includes the step of heating the first and second eutectic bonding materials to a temperature above a eutectic temperature of an alloy of the first and second eutectic bonding materials to allow a hypoeutectic alloy to form out of the first and second eutectic bonding materials. The method includes the further step of cooling the hypoeutectic alloy to form a solid solution alloy bonding the first and second components together.

32 Claims, 7 Drawing Sheets

U.S. PATENT DOCUMENTS

| | | | |
|---|---|---|---|
| 4,910,578 A | 3/1990 | Okamoto | |
| 4,912,543 A | 3/1990 | Neppl et al. | |
| 4,939,497 A | 7/1990 | Nishida et al. | |
| 4,960,718 A | 10/1990 | Aina | |
| 5,038,996 A * | 8/1991 | Wilcox et al. | 228/121 |
| 5,181,417 A | 1/1993 | Nishida et al. | |
| 5,182,218 A | 1/1993 | Fujihira | |
| 5,200,349 A | 4/1993 | Yokoyama | |
| 5,285,097 A | 2/1994 | Hirai | |
| 5,286,671 A | 2/1994 | Kurtz et al. | |
| 5,346,855 A | 9/1994 | Byrne et al. | |
| 5,369,300 A | 11/1994 | Heideman et al. | |
| 5,374,564 A | 12/1994 | Bruel | |
| 5,436,491 A | 7/1995 | Hase et al. | |
| 5,457,345 A | 10/1995 | Cook et al. | |
| 5,536,967 A | 7/1996 | Yokoyama | |
| 5,559,817 A | 9/1996 | Derkits, Jr. et al. | |
| 5,600,071 A | 2/1997 | Sooriakumar et al. | |
| 5,637,905 A | 6/1997 | Carr et al. | |
| 5,641,994 A | 6/1997 | Bollinger et al. | |
| 5,665,921 A | 9/1997 | Gerst et al. | |
| 5,670,823 A | 9/1997 | Kruger et al. | |
| 5,675,159 A | 10/1997 | Oku et al. | |
| 5,802,091 A | 9/1998 | Chakrabarti et al. | |
| 5,882,532 A | 3/1999 | Field et al. | |
| 5,882,738 A | 3/1999 | Blish, II et al. | |
| 5,935,430 A * | 8/1999 | Craig | 210/198.2 |
| 5,955,771 A | 9/1999 | Kurtz et al. | |
| 6,027,957 A | 2/2000 | Merritt et al. | |
| 6,050,145 A | 4/2000 | Olson et al. | |
| 6,058,782 A | 5/2000 | Kurtz et al. | |
| 6,122,974 A | 9/2000 | Sato et al. | |
| 6,191,007 B1 | 2/2001 | Matsui et al. | |
| 6,234,378 B1 | 5/2001 | Ford et al. | |
| 6,272,928 B1 | 8/2001 | Kurtz | |
| 6,320,265 B1 | 11/2001 | Chakrabarti et al. | |
| 6,363,792 B1 | 4/2002 | Kurtz et al. | |
| 6,447,923 B1 | 9/2002 | Yamakawa | |
| 6,452,427 B1 | 9/2002 | Ko et al. | |
| 6,465,271 B1 | 10/2002 | Ko et al. | |
| 6,530,282 B1 | 3/2003 | Kurtz et al. | |
| 6,564,644 B1 | 5/2003 | Kurtz | |
| 6,566,158 B2 | 5/2003 | Eriksen et al. | |
| 6,586,330 B1 | 7/2003 | Ludviksson et al. | |
| 6,595,066 B1 | 7/2003 | Kurtz et al. | |
| 6,608,427 B2 | 8/2003 | Akiyama et al. | |
| 6,612,178 B1 | 9/2003 | Kurtz et al. | |
| 6,706,549 B1 | 3/2004 | Okojie | |
| 6,773,951 B2 | 8/2004 | Eriksen et al. | |
| 6,845,664 B1 | 1/2005 | Okojie | |
| 6,928,878 B1 | 8/2005 | Eriksen et al. | |
| 6,932,951 B1 | 8/2005 | Losey et al. | |
| 6,956,268 B2 | 10/2005 | Faris | |
| 7,152,482 B2 | 12/2006 | Ueno et al. | |
| 7,233,094 B2 | 6/2007 | Akiyama et al. | |
| 2003/0108674 A1 | 6/2003 | Chung et al. | |
| 2003/0201530 A1 | 10/2003 | Kurihara et al. | |
| 2004/0079163 A1 | 4/2004 | Clerc et al. | |
| 2005/0042865 A1 | 2/2005 | Cabral et al. | |
| 2005/0236710 A1 | 10/2005 | Akiyama et al. | |
| 2006/0032582 A1 | 2/2006 | Chen et al. | |
| 2006/0144154 A1 | 7/2006 | Ueno et al. | |

FOREIGN PATENT DOCUMENTS

| | | |
|---|---|---|
| EP | 0119691 | 9/1984 |
| EP | 0 552 466 * | 12/1992 |
| EP | 0585084 | 3/1994 |
| EP | 1069419 | 1/2001 |
| GB | 2221570 | 2/1990 |
| WO | 03/103066 | 12/2003 |
| WO | 2004/031711 | 4/2004 |

OTHER PUBLICATIONS

DeBlasi, J.M. et al., Characteristics of $TaSi_2$/Poly-Si Films Oxidized in Steam for VLSI Applications, *J. Electrochem. Soc.: Solid-State Science and Technology*, pp. 2478-2482 (Dec. 1983).

Das, S.R., et al., "Thickness dependence of the properties and thermal stability of PtSi films," *Thin Solid Films*, 253, pp. 467-472 (1994).

Holloway, K. et al., "Tantalum as a diffusion barrier between copper and silicon: Failure mechanism and effect of nitrogen addition," *J. Appl. Phys.*, 71(11), pp. 5433-5444 (Jun. 1992).

Crider, C.A. et al., "Platinum silicide formation under ultrahigh vacuum and controlled impurity ambients," *J. Appl. Phys.* 52 (4), pp. 2860-2868 (Apr. 1981).

Saraswat, K.C. et al., Thermal oxidation of tantalum silicide in $O_2$ and $H_2O$, *Appl. Phys. Lett.*, 41 (12), pp. 1127-1129 (Dec. 1982).

Lee, H.G., "Thermodynamic considerations of thermal oxidation of metal silicides," *Thin Solid Films*, 216, pp. 230-234 (1992).

Berstein et al., "Applications of Solid-Liquid Interdiffusion (SLID) Bonding in Integrated-Circuit Fabrication," Transactions of the Metallurgical Society of AIME, vol. 236, pp. 405-412 (Mar. 1966).

Newport Newsletter entitled "Solutions For Dispense, Assembly, and Soldering, The Newsletter of MRSI Group," vol. III, No. 1 (Jan. 2000).

Klumpp et al., "Vertical System Integration by Using Inter-Chip Vias and Solid-Liquid Interdiffusion Bonding," Japanese Journal of Applied Physics, vol. 43, No. 7A, pp. L829-L830 (Jun. 11, 2004).

IZM Institut paper entitled "The SLID-ICV technigue introduced by FHG: Face-to-Face Solid Technology," (date unknown) Applicants admit the status of this publication as prior art for the limited purpose of examination of this application, but otherwise reserve the right to challenge the status of this publication as prior art.

Garrou, "Future ICs Go Vertical," Reed Electronics, (Feb. 1, 2005).

IZM Institut article entitled "Selected Results from Si-Technologie and Vertikale System Intefration: Vertical System Integration," (Mar. 14, 2005).

Sinha, A.K. et al., "Effect of alloying behavior on the electrical characteristics of n-GaAs Schottky diodes metallized with W, Au, and Pt," *Appl. Phys. Lett.*, vol. 23, No. 12, pp. 666-668 (1973).

Guivarc'h, A. et al., "Growth of RhGa on GaAs (001) in a molecular beam epitaxy system," *Appl. Phys. Lett.*, 52 (12), pp. 948-950 (Mar. 21, 1988).

Sinha, A.K. et al., "n-GaAs Schottky Diodes Metallized with Ti and Pt/Ti," *SSE*, vol. 19, No. 6-E, pp. 489-492 (1976).

Kumar, J. et al., "Reaction of Sputtered Pt Films on GaAs," *Phys. Chem. Solids*, vol. 36, pp. 535-541 (1975).

Fukuda, M., *Reliability and Degradation of Semiconductor Lasers and LEDs*, Chapter 6, Artech House, pp. 185-205 (1991).

Zengh, X.Y. et al., "Solid State Phase Equilibria in the Pt-Ga-As System," *Journal of Less-Common Metals*, 146, pp. 233-239 (1989).

Lince, J.R. et al., "The growth of $AuGa_2$ thin films on GaAs (001) to form chemically unreactive interfaces," *J. Mater. Res*, 1 (4), pp. 537-542 (Jul./Aug. 1986).

Okojie et al., "Stable Ti/$TaSi_2$/Pt Ohmic Contacts on N-Type 6H-SiC Epilayer at 600° C in Air," Materials Research Society Symposium Proceedings, vol. 622, (2000).

Lee, "Thermodynamic considerations of thermal oxidation of metal silicides," Thin Solid Films, 216, pp. 230-234 (1992).

Liu et al., "Annealing effects of tantalum films on Si and $Sio_2$/Si substrates in various vacuums," Journal of Applied Physics, vol. 90, No. 1, pp. 416-420 (Jul. 1, 2001).

Doppalapudi et al., "SiC-Microhotplate Conductometric Sensor Array for NOx, CO, and Hydrocarbon Monitoring of Hot Engine Emissions," U.S. Environmental Protection Agency, National Center For Environmental Research, (2002/2003).

PCT, Partial International Search, PCT/US2007/078837 (Oct. 3, 2008).

PCT, Partial International Search, PCT/US2007/078831 (Sep. 12, 2008).

Takeyama, M. et al., "Properties of $TaN_x$ films as diffusion barriers in the thermally stable Cu/Si contact systems," J. Vac. Sci. Techol. B 14(2), pp. 674-678 (Mar./Apr. 1996).

Reid, J.S. et al., "Amorphous (Mo, Ta, or W)-Si-N diffusion barriers for Al metallizations," J. Appl. Phys. 79 (2), pp. 1109-1115 (Jan. 1996).

Kaloyeros, A.E. et al., "Ultrathin Diffusion Barriers/Liners for Gigascale Copper Metallization," Annu. Rev. Mater. Sci 30, pp. 363-385 (2000).

Chason, E. et al., "Applied Physics Reviews—Ion beams in silicon processing and characterization," J. Appl. Phys. 81 (10), pp. 6513-6561 (May 1997).

McCluskey, P. et al., "Pushing the Limit: The Rise of High Temperature Electronics," Advanced Packaging, vol. 4, No. 1 (Jan./Feb. 1997).

Mantese, J.V. et al., "Platinum Wire Wedge Bonding: A New IC and Microsensor Interconnect," Journal of Electronic Materials, vol. 17, No. 4, pp. 285-289 (1988).

Guo, S. et al., "A monolithically integrated surface micromachined touch mode capacitive pressure sensor," Sensors and Actuators 80, pp. 224-232 (2000).

Kurtz, A.D. et al., "Ultra High Temperature, Miniature, SOI Sensors for Extreme Environments," by Kulite Semiconductor Products, Inc., Presented at the IMAPS International HiTEC 2004 Conference (May 2004).

Kühnel, W. et al., "Silicon Subminiature Microphones for Airborne Sound," Acustica, vol. 73, pp. 90-99 (1991).

Sheplak, M. et al., "A MEMS Microphone for Aeroacoustics Measurement" (1999).

Internet web page of LAI International, Inc., "Advanced Laser and Waterjet Machining Services for Industry" (date of first publication unknown), Applicants admit the status of this publication as prior art for the limited purpose of examination of this application, but otherwise reserve the right to challenge the status of this publication as prior art, (May 2006).

International Search Report and Written Opinion, PCT/US2007/078831 (Mar. 6, 2009).

Welch III et al., "Transient liquid phase (TLP) bonding for microsystem packaging applications,"Digest of Technical Papers—International Conference on Solid State Sensors and Actuators and Microsystems, Transducers '05; 13th International Conference on Solid-State Sensors and Actuators and Microsystems—Digest of Technic., vol. 2, pp. 1350-1353 (2005).

"Inexpensive, high-temperature aluminum nitride film sensor enables vibration and acoustic sensing even within jet engines," web page of yet2.com, Inc., http://www.yet2.com (9 pages) (Jun. 12, 2009).

* cited by examiner

TRANSIENT LIQUID PHASE EUTECTIC BONDING

The present invention is directed to a method for transient liquid phase eutectic bonding and a structure including two components joined together by transient liquid phase eutectic bonding.

BACKGROUND

In the manufacture of micromachined devices, microelectromechanical systems ("MEMS"), microdevices, microstructures and the like (collectively termed microstructures), it is often desired to join various parts, wafers, portions of wafers, components, substrates and the like together. The parts, wafer, portions of wafers, components, substrates and the like that are to be joined together may be relatively large components (i.e. having, for example, a surface area of several inches) but may carry a relatively high number of small microstructures thereon. The joint that couples the two components must be sufficiently robust to withstand subsequent processing steps and to withstand environmental conditions to which the assembled structure may be exposed (i.e., high temperatures, corrosive environments, etc.).

When coupling two substrates together, each substrate typically has a layer of bonding material located thereon. The bonding material on one substrate can react with a bonding material on the other substrate to couple the substrates together. Each substrate may include an adhesion layer located below the bonding material and on top of the substrate to secure the bonding materials to the underlying substrate.

The adhesion and bonding materials are chosen based upon various criteria including: 1) the materials of the adhesion layer should react with or adhere to the associated substrate during the deposition of the adhesion layer or during subsequent bonding of the bonding materials; 2) the materials of the bonding layer should react with or adhere to the associated adhesion layer, or take part in the reaction of the adhesion layer with the substrate; 3) the bonding material on one substrate should form a covalent or chemical or alloying bond with the bonding material on the other substrate; 4) the joint formed during bonding should be formed in either the liquid state or in the solid state (i.e., through chemical bonding or solid state diffusion); and 5) the bonding materials should form reaction products or alloys that are stable at service temperatures (which could be relatively high temperatures) and should maintain their mechanical and electrical properties after prolonged exposure to the service temperatures. It is also desired to having bonding materials which can be bonded at a relatively low temperature to provide a resultant alloy which has a relatively high melting temperature.

SUMMARY

In one embodiment the present invention is a bonding method, as well as a bonded structure, which meets the various criteria outlined above. In particular, the bonding method provides a bond which can be formed at relatively low temperatures yet can withstand relatively high temperatures.

In particular, in one embodiment the invention is a method for bonding two components together including the steps of providing a first component, providing a second component, and locating a first eutectic bonding material between the first and second component. The first eutectic bonding material includes at least one of germanium, tin, or silicon. The method further includes the step of locating a second eutectic bonding material between the first and second component and adjacent to the first eutectic bonding material. The second eutectic bonding material includes gold. The method further includes the step of heating the first and second eutectic bonding materials to a temperature above a eutectic temperature of an alloy of the first and second eutectic bonding materials to allow a hypoeutectic alloy to form out of the first and second eutectic bonding materials. The method includes the further step of cooling the hypoeutectic alloy to form a solid solution alloy bonding the first and second components together.

Other objects and advantages of the present invention will be apparent from the following description and the accompanying drawings.

DETAILED DESCRIPTION

Figure 1:
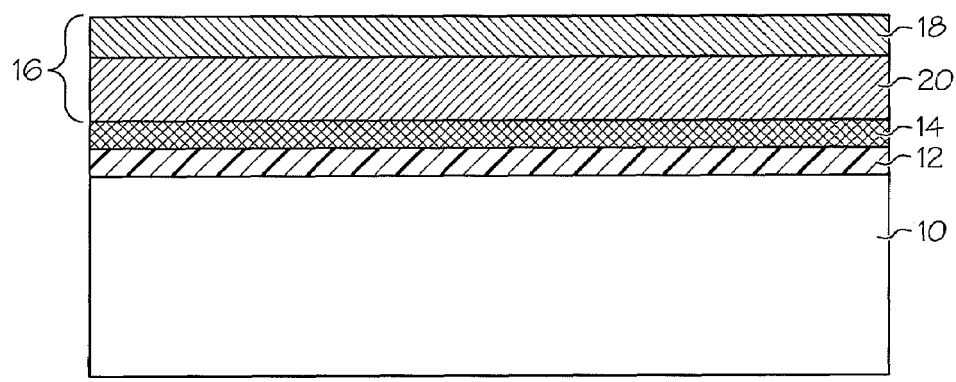
FIG. 1 is a side cross section of a component having a bonding layer located thereon.

FIG. 1 illustrates a substrate 10, component or the like, which is desired to be coupled to another substrate, component or the like. The substrate 10 can be any of a wide variety of materials, including but not limited to semiconductors (such as silicon), ceramics, aluminum oxide, polysilicon, silicon carbide, polyimide, sapphire, silicon nitride, glasses, a combination of materials or nearly any other materials as desired to be joined. When the substrate 10 is a ceramic material, this may include materials such as aluminum nitride or any inorganic, nonmetallic material that include clay, minerals, cement, and/or glass. The substrate 10 is preferably a wafer or a portion of a wafer, and can be or include a microstructure or transducer (such as a sensor or actuator, not shown). The substrate 10 may be part of a microstructure, and/or can include various micromachined mechanical features, electrical circuitry, bond pads, etc. (not shown) located thereon.

In the illustrated embodiment, the substrate 10 includes an adhesion layer 12 located thereon, a diffusion barrier (also termed an anti-diffusion layer) 14 located on the adhesion layer 12, and bonding materials or a bonding layer 16 located on the diffusion barrier 14. It should be understood that when a layer or component is referred to as being located "on" or "above" another layer, component or substrate, (such as the bonding layer 16 being located on the diffusion barrier 14)

this layer or component may not necessarily be located directly on the other layer, component or substrate, and intervening components, layers or materials could be present. Furthermore, when a layer or component is referred to as being located "on" or "above" another layer, component or substrate, that layer or component may either fully or partially cover the other layer, component or substrate.

The adhesion layer 12 adheres well to the substrate 10, as well as to the diffusion barrier 14 and/or bonding layer 16. The adhesion layer 12 also preferably adheres well to any subsequent compounds formed within the various layers 10, 14, 16 during the bonding process (as will be described below). The adhesion layer 12 preferably has an adhesion strength to a silicon substrate of at least about 100 MPa as measured by a mechanical shear test. For example adhesion strength can be determined by a die shear strength test specified in Military Standard 883, Procedure 2019.5, or methods similar thereto.

The adhesion layer 12 can be made of a variety of materials, including tantalum, titanium, chromium, zirconium or any element which will form a covalent or chemical compound with the substrate 10. In a preferred embodiment, the adhesion layer 12 has a thickness between about 100 Angstroms and about 10,000 Angstroms, and more preferably, between about 200 Angstroms and about 1,000 Angstroms, and most preferably, about 500 Angstroms (the drawings of FIGS. 1-11 not necessarily being drawn to scale). The adhesion layer 12 is deposited in a variety of manners, including by plasma enhanced physical vapor deposition (also known as plasma sputtering) or any other suitable deposition techniques known to those skilled in the art.

Inward diffusion of materials (i.e. from the ambient atmosphere or from the bonding layer 16) to the adhesion layer 12 and/or to the substrate 10 can cause chemical reactions that weaken the adhesion layer 12 and/or substrate 10 or can otherwise adversely affect their properties. Conversely, outward diffusion of materials (i.e. outwardly from adhesion layer 12 and/or from substrate 10 to the bonding layer 16) can weaken or otherwise adversely affect the materials of the bonding layer 16. Accordingly, the diffusion barrier 14 is provided to generally block both inward and outward diffusion of materials.

For example, the diffusion barrier 14 generally blocks the inward diffusion of the materials of the bonding layer 16 or the diffusion of gases that may be present in the ambient atmosphere such as oxygen, nitrogen, and the like. The diffusion barrier 14 also generally blocks the outward diffusion of the materials of the substrate 10 and adhesion layer 12. Alternately, rather than directly blocking diffusion itself the diffusion barrier 14 provides materials or combines with other materials to form reactive byproducts that prevent inward and outward diffusion. Thus the diffusion barrier 14 thereby prevents undesirable compounds from forming throughout the various layers of the bonded components.

The diffusion barrier 14 may include several sub-layers, but is shown as a single layer herein for illustrative purposes. The diffusion barrier 14 can be made of a variety of materials including but not limited to tantalum silicide, platinum silicide, tantalum, platinum, tungsten, molybdenum or a combination of these materials. The diffusion barrier layer 14 has a variety of thicknesses, for example, preferably between about 100 Angstroms and about 10,000 Angstroms, and more preferably between about 1,000 Angstroms and about 10,000 Angstroms, and most preferably about 5,000 Angstroms.

The bonding layer 16 includes a material or materials which preferably can form a eutectic or binary alloy with another material under appropriate conditions. In the embodiment shown in FIG. 1, the bonding layer 16 includes first 18 and second 20 bonding materials or layers that can form eutectics with each other. For example, the first bonding material 18 is preferably germanium, tin or silicon, but can be any element or material that can form a eutectic alloy with the second bonding material 20. The second bonding material 20 is preferably gold, but can be any element or material that can form a eutectic alloy with the first bonding material 18. In the illustrated embodiment the second bonding material 20 is located between the first bonding material 18 and the diffusion barrier 14.

Both the first 18 and second 20 bonding materials may be deposited on the substrate 10 by plasma sputtering or other suitable deposition techniques known to those skilled in the art. Further, the first 18 and second 20 bonding materials can be deposited in a variety of thicknesses. As will be described in greater detail below, the thickness of the bonding materials 18, 20 should be selected to provide the desired ratio between the first 18 and second 20 bonding materials in the end product bond.

Figure 2:
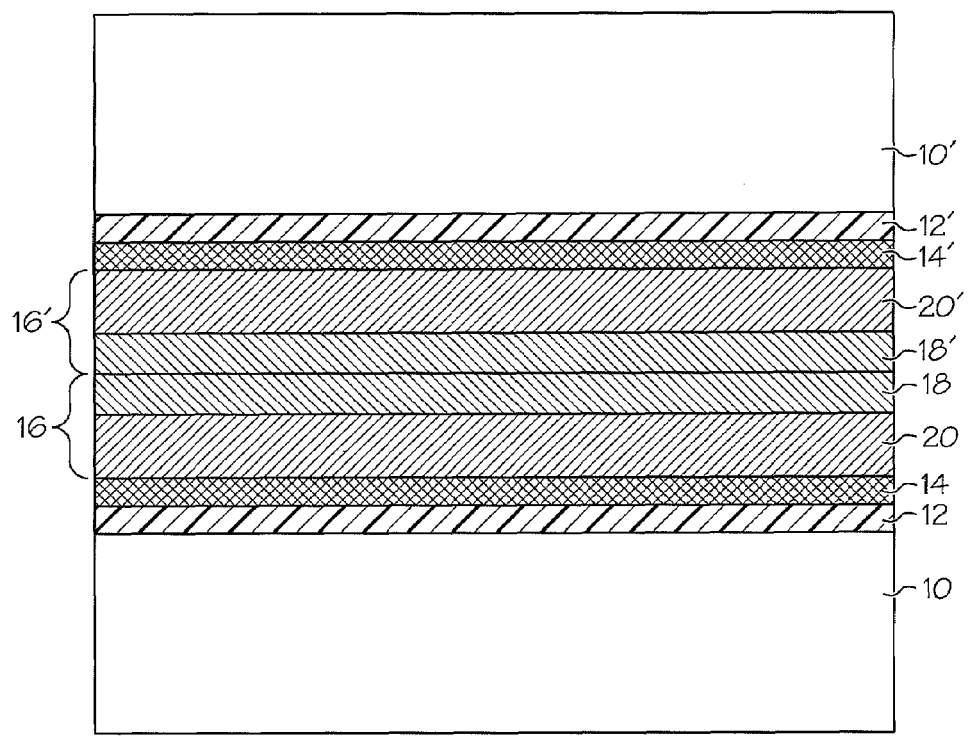
FIG. 2 is a side cross section of the component of FIG. 1, with another component positioned thereon.

FIG. 2 illustrates two substrates 10, 10' that are desired to be coupled or bonded. Each of the substrates 10, 10' includes its own corresponding adhesion layers 12, 12', diffusion barriers 14, 14', and bonding layers 16, 16' (including bonding materials 18, 20 and 18', 20' respectively). The substrates 10, 10' are arranged such that the first bonding materials 18, 18' are adjacent to each other or in contact each other.

Figure 3:
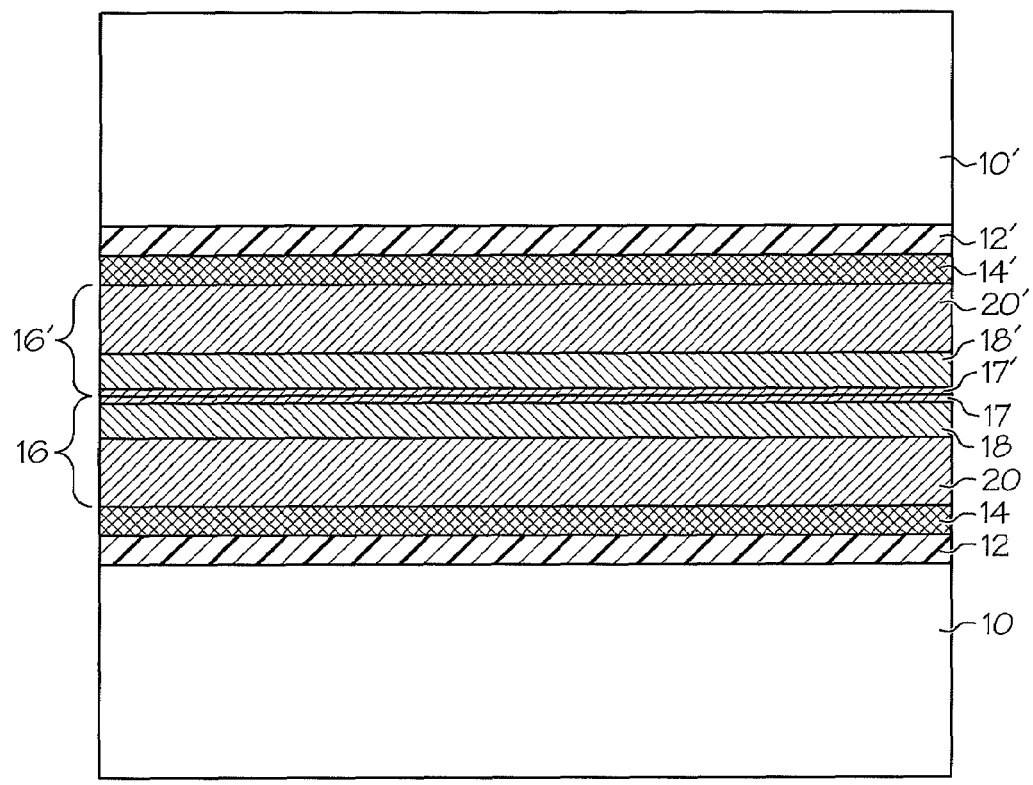
FIG. 3 is a side cross section of the components of FIG. 2, with capping layers located between the two components.

FIG. 3 illustrates an alternate arrangement to the structure of FIG. 2. In this case a capping layer 17, 17' is located on each respective bonding material 18, 18' such that each bonding material 18, 18' is located between its respective capping layer 17, 17' and its respective second bonding layer 20, 20' and substrate 10, 10'. Each capping layer 17, 17' caps and protects the first bonding materials 18, 18' to prevent oxidation of the first bonding materials 18, 18' (i.e. when the substrates 10, 10' are not stacked in the manner shown in FIG. 3). Each capping layer 17, 17' can be any of a wide variety of materials which resist oxidation, such as gold. Each capping layer 17, 17' is preferably the same material as the second bonding layer 20, 20' so that the capping layers 17, 17' participate in the eutectic joining between the first bonding layer 18, 18' and second bonding layer 20, 20'. Each capping layer 17, 17' is quite thin, preferably having a thickness of about 1000 Angstroms or less.

Figure 12:
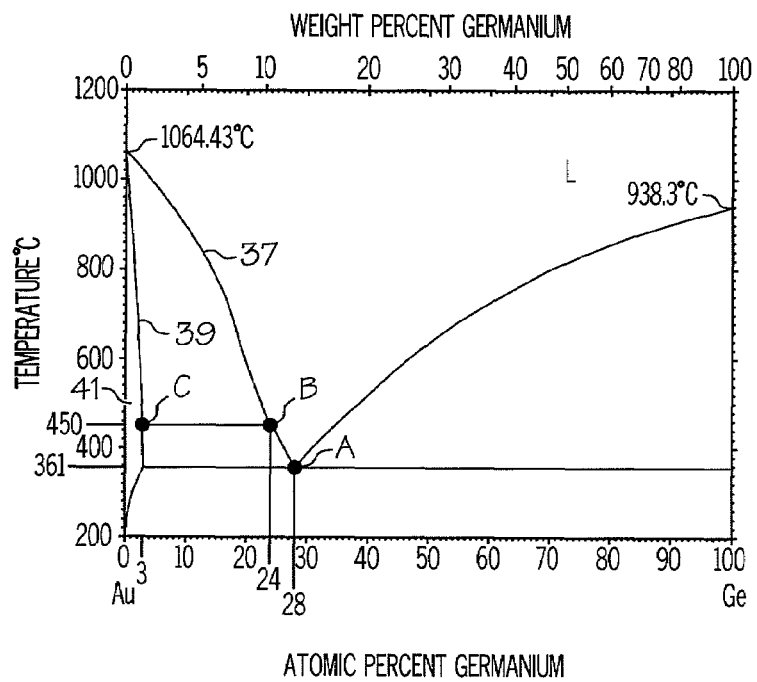
FIG. 12 is a eutectic diagram for germanium/gold alloys.

For the description below, it will be assumed that the first bonding materials 18, 18' are germanium, and that the second bonding materials 20, 20' and capping layers 17, 17' are gold to allow discussion of the specific properties of the gold/germanium eutectic alloy. In this example, FIG. 12 illustrates the phase diagram for germanium/gold alloys. However, this discussion is for illustrative purposes and it should be understood that various other materials may be utilized as the first bonding materials 18, 18', second bonding materials, 20, 20' and capping materials 17, 17'.

In order to join the substrates 10, 10', the bonding layers 16, 16' are bonded in a transient liquid phase bonding process which is well known in the art, but is outlined briefly below and shown in FIGS. 4-9. To commence the transient liquid phase bonding a light pressure (e.g. a few pounds) is applied to press the substrates 10, 10' and bonding layers 16, 16' together. The bonding layers 16, 16' are then exposed to a temperature at or above the eutectic point or eutectic temperature of the bonding alloy, i.e. a gold/germanium alloy. For example, as can be seen in FIG. 12, the eutectic temperature of a gold/germanium alloy is about 361° C.

In the illustrative example the bonding layers 16, 16' are exposed to a temperature of about 450° C. (which is a temperature that is 890 over the eutectic temperature). For many applications, the bonding layers 16, 16' are exposed to a temperature between about 20° C. and about 160° C. above the eutectic temperature, (89° C. in the illustrated embodiment.) However, the actual bonding temperatures will depend upon the diffusion rate of the bonding materials 17, 17', 18, 18', 20, 20', the thickness of the bonding materials and the time available to complete the diffusion such that a uniform solid solution of the bonding alloy is achieved.

Figure 4:
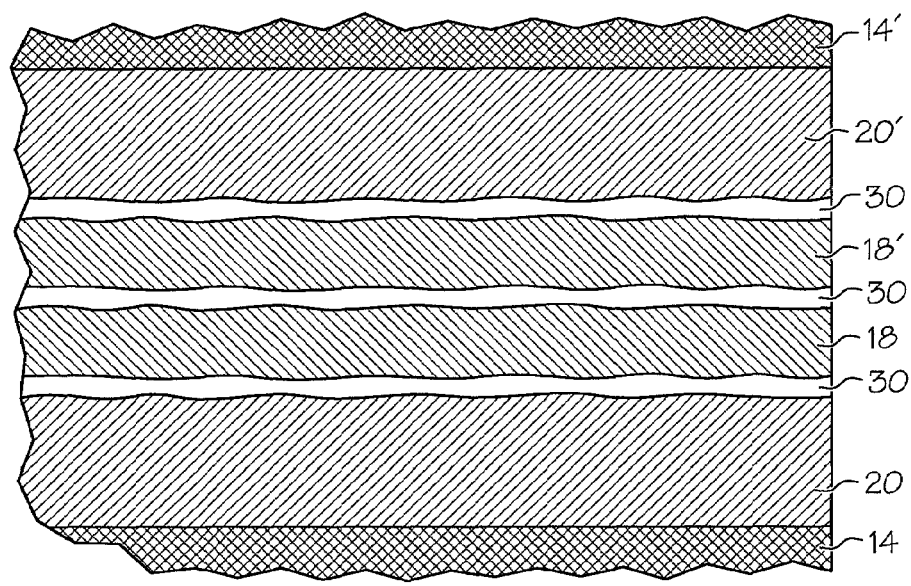
FIG. 4 is a detail side cross section of the components of FIG. 3, after partial heating and melting.

Once the materials at the gold/germanium interfaces reach the eutectic temperature (i.e., 361° C.), zones of melted or liquid materials 30 are formed at each interface (see FIG. 4) due to the melting of materials. In FIG. 4, the entire capping layers 17, 17' have melted (due to the thinness of those layers) to form the central liquid zone 30, and portions of the first bonding layers 18, 18' have melted to form the top and bottom liquid zones 30. Each zone of liquid material 30 has a composition that is at or near the eutectic composition. In particular, as can be seen in FIG. 12, the lowest melting point for gold-germanium alloys (361° C.) is provided by gold-germanium alloys having a composition at point A (the eutectic point). Thus, the initially-formed liquid zones 30 have the lowest possible melting point for gold-germanium alloys and have about twenty-eight atomic percent germanium and seventy-two atomic percent gold (12.5 weight percent germanium and 87.5 weight percent gold).

Figure 5:
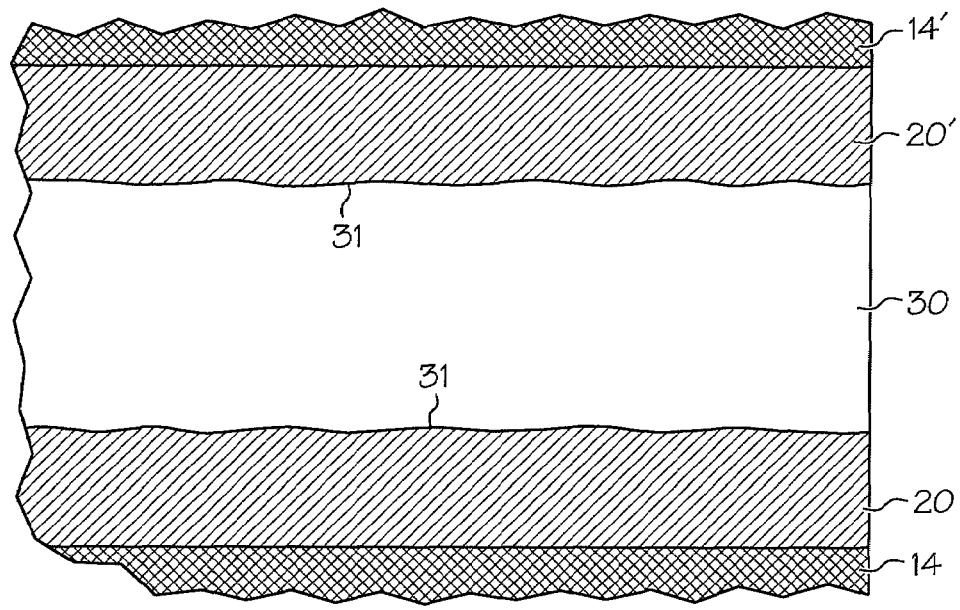
FIG. 5 is a side cross section of the components of FIG. 4, after further heating and melting.

As the bonding layers 16, 16' continue to heat up and approach the ambient temperature (i.e., 450° in the illustrated example), the liquid zones 30 continue to grow and expand until all the material of the germanium layers 18, 18' melt and have been dissolved into the liquid zones 30. The separate liquid zones 30 of FIG. 4 grow and ultimately combine to form a single larger liquid zone 30 (FIG. 5). At the time shown in FIG. 5, the last of the material of the germanium layers 18, 18' have been dissolved, and the liquid zone 30 remains at composition A.

Next, the materials of the gold layers 20, 20' adjacent to the liquid zone 30 continue to liquefy as the surrounding materials approach the ambient temperature. As additional gold is melted and added to the liquid zone 30, the germanium in the liquid zone 30 is diluted and the percentage of germanium in the liquid zone 30 is thereby reduced. Thus, the composition of the liquid zone 30 moves up and to the left of point A along the liquidus line 37 of FIG. 12. As the melted gold continues to dilute the germanium, the liquid composition ultimately reaches the composition at point B of FIG. 12 when the liquid zone 30 reaches the ambient temperature of 450° C.

Figure 6:
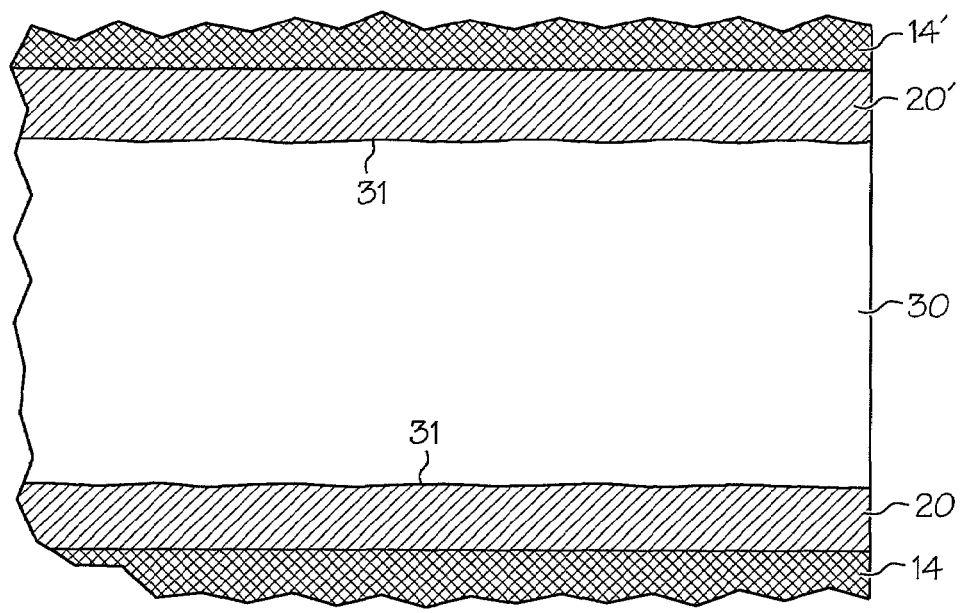
FIG. 6 is a side cross section of the components of FIG. 5, after even further heating and melting.
Figure 7:
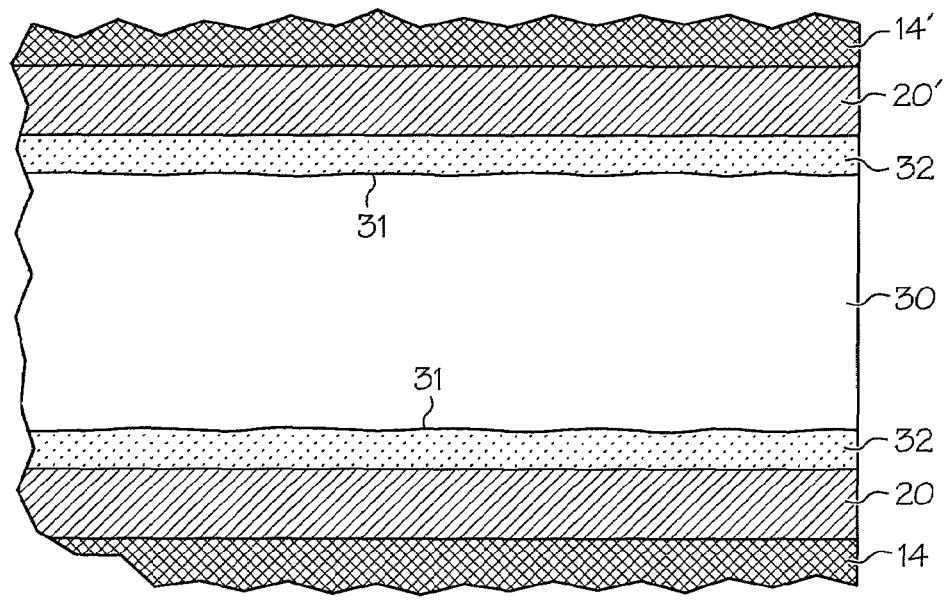
FIG. 7 is a side cross section of the structure of FIG. 6, after initial solid formation.

FIG. 6 illustrates the bonding process wherein the liquid zone 30 has grown and added gold such that the liquid zone 30 is at composition B. At this stage the liquid zone 30 has reached the ambient temperature of 450° C., and has a composition of about 24 atomic percent germanium and 76 atomic percent gold.

Once the composition of the liquid zone 30 reaches point B, the germanium in the liquid zone 30 begins diffusing into the remaining solid gold layers 20, 20' at the interface 31 of the liquid zone 30 and the gold layers 20, 20'. As this occurs, the concentration of germanium in the liquid zone 30 adjacent to the interface 31 drops. Once the percentage of germanium at the interface 31 drops sufficiently low (i.e., about 3 atomic percent germanium or less), the liquid zone 30 at the interface 31 forms into a solid solution phase 32 (see FIG. 7). The newly-formed solids 32 have a composition indicated at point C on the graph of FIG. 12. As can be seen in FIG. 12, the point C is located on the solidus line 39, which indicates the percentage of germanium at which solids will form for a given temperature. Thus the newly-formed solids 32 have about 3 atomic percent germanium and 97 atomic percent gold.

Figure 8:
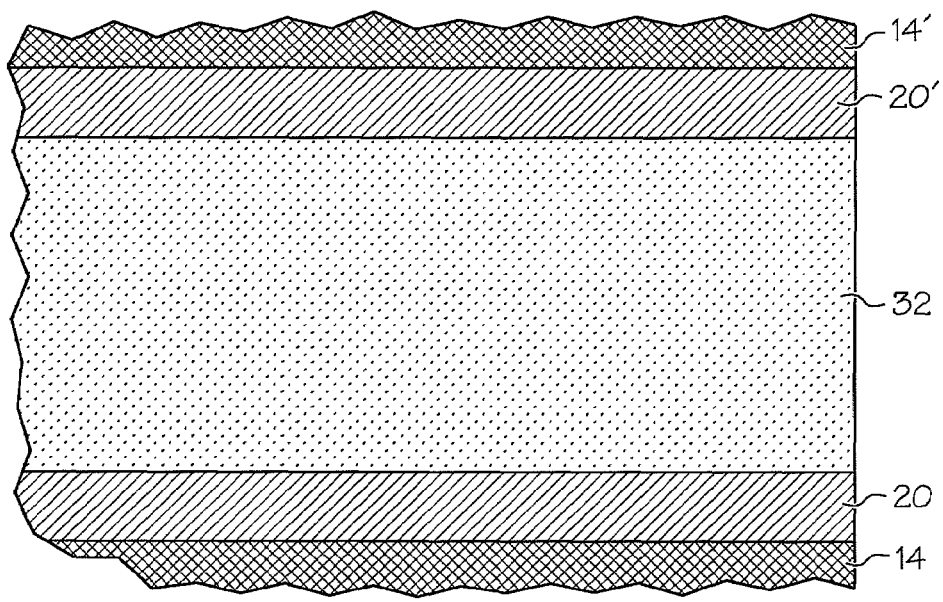
FIG. 8 is a side cross section of the structure of FIG. 7, after full solid formation.

The ambient temperature continues to be held at 450° C. and remaining germanium in the liquid zone 30 continues to diffuse outwardly, into and through the newly-formed solids 32 and into the predominantly gold layers 20, 20'. As the germanium in the liquid zone 30 continues to diffuse outwardly, more germanium-poor liquids at the interface 31 of the liquid zone 30 and the solids 32 are created and ultimately form into solids 32. In this manner the solids 32 grow inwardly until the entire liquid zone 30 is consumed (FIG. 8). At this point the solid 32 may be relatively germanium-rich (i.e., 3 atomic percent germanium) and the surrounding gold layers 20, 20' may be relatively germanium-poor (i.e. less than 3 atomic percent germanium). In this case the germanium continues to diffuse, through solid-state diffusion, from the solid 32 into the gold layers 20, 20' until equilibrium is reached and both the solid 32 and the gold layers 20, 20' all have the same composition (shown as solid 32 in FIG. 9).

In one embodiment, rather than carrying out the bonding and solid state diffusion at the same temperature, the bonding and solid state diffusion can be carried out at different temperatures. For example, the bonding may take place at, for example, 450° C., and the solid-state diffusion shown in FIGS. 8 and 9 may take place at an elevated temperature such as 500° C. However, the particular bonding and solid-state diffusion temperatures will depend upon the properties of the bonding materials 16, 16'.

Figure 9:
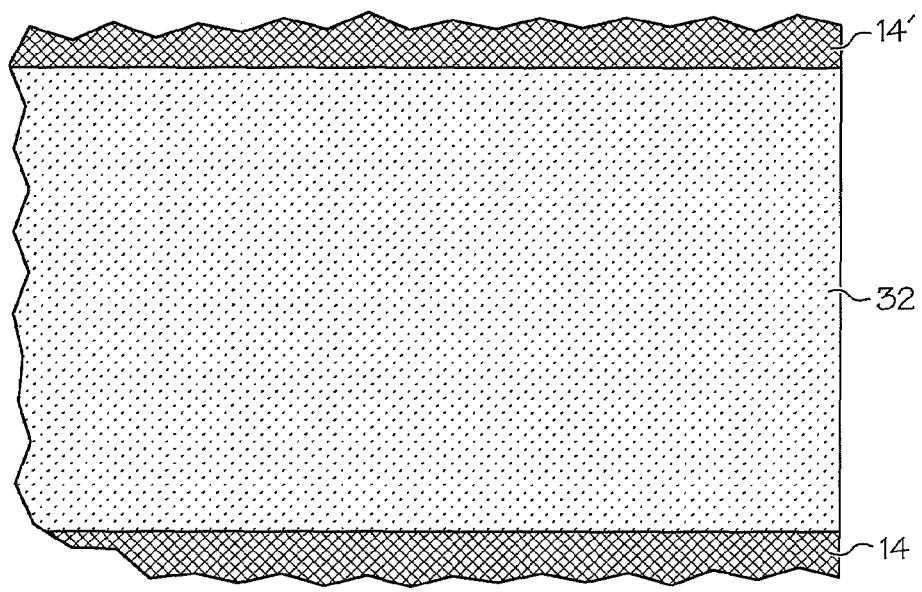
FIG. 9 is a side cross section of the structure of FIG. 8, after solid state diffusion.
Figure 10:
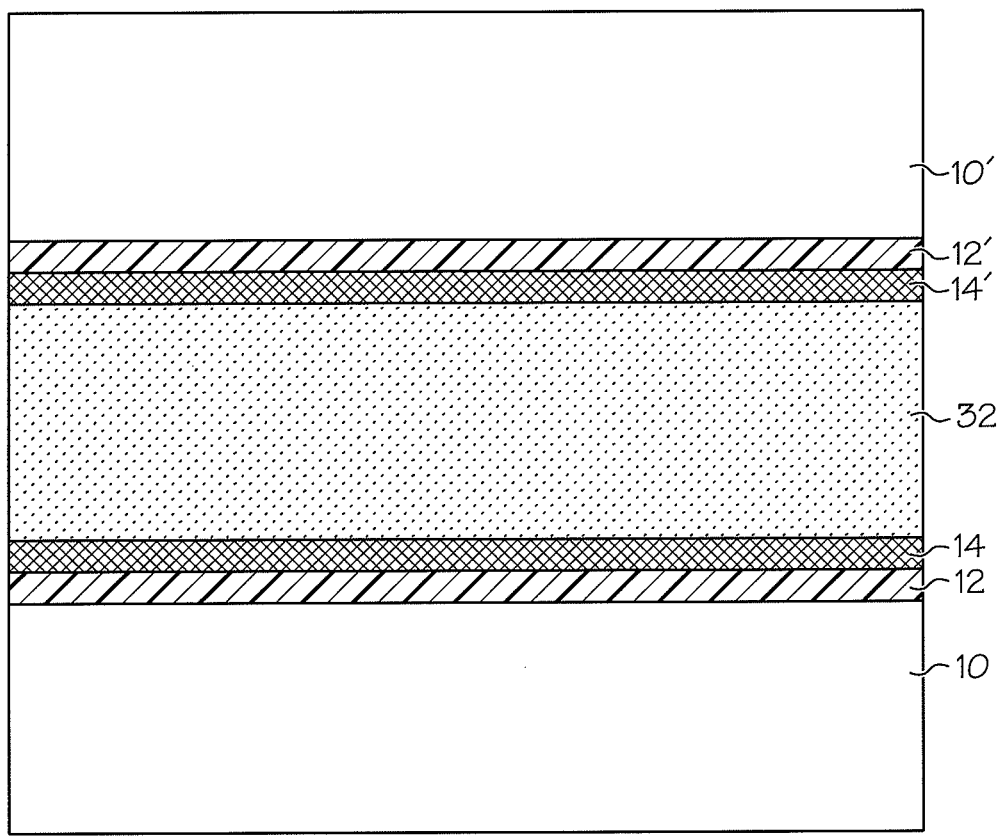
FIG. 10 is a side cross section view of the components of FIG. 3 after joining.

After all of the liquid 30 has been consumed, the structure in FIGS. 9 and 10 is formed and the resultant solid solution 32 bonds the two substrates 10, 10' together. The solid 32 formed after solid state diffusion is a gold/germanium alloy or solid solution alloy that may have a composition at point C of FIG. 12 (i.e. about 3 atomic percent germanium).

As shown in FIG. 12, when the solid solution 32 has a composition at point C, the solid solution 32 has an atomic percentage of about 3 atomic percent germanium and a melting temperature of 450° C. However, the amount of available germanium may be restricted such that the resultant solid 32 has a composition of less than 3 atomic percent germanium (e.g., as low as about 0.5 atomic percent germanium or even lower). With reference to the phase diagram of FIG. 12, reducing the atomic percentage of germanium to lower than 3 atomic percent provides a solution located on the solidus line 39 above and to the left of point C. Moving the composition to the left of point C provides a solid solution 32 with a melting point above 450° C., up to a theoretical maximum of 1064° C.

The initial thicknesses of the gold 20, 20' and germanium layers 18, 18' determine the end composition of the solid solution 32. In particular, in one embodiment the initial germanium layers 18, 18' (i.e. of FIG. 3) each have a thickness of about 300 Angstroms, and the initial gold layers 20, 20' each have a thickness of about 30,000 Angstroms (with, in this example, no or negligible gold being provided by the capping layers 17, 17'). Thus, the relative thicknesses of the gold and germanium layers can be selected and controlled to ensure that the resultant solid solution 32 has the desired amount of germanium (i.e., in this example about 1 atomic percent) upon complete diffusion of the germanium in the gold.

In a further example, the initial germanium layers 18, 18' each have a thickness of about 150 Angstroms and the initial gold layers 20, 20' each have a thickness of about 30,000 Angstroms (again, with no or negligible gold being provided by the capping layers 17, 17'). In this example the end bond or solid solution material 32 has 0.5 atomic percent germanium.

It may be desired to increase the thickness of the gold layers 20, 20' to provide a solid solution 32 with an elevated higher melting temperature. It may also be desired to reduce the thickness of the germanium layer, but the germanium layers 18, 18' should have a sufficient thickness to form an initial liquid surface of sufficient volume to ensure the germanium/gold layers 18, 18'/20, 20' flow together in the liquid state and fill any gaps to provide a complete bond. When materials other than gold and germanium are used as the eutectic materials, the relative thicknesses for these other materials would be adjusted based upon their material properties and their phase diagram to provide the desired composition for the end bond material.

In order to further reduce the amount of germanium in the end product solid solution 32, a germanium-scavenging material may be provided and located in the second bonding material 20, 20'. At a sufficient temperature, the germanium-scavenging material will react with the germanium 18, 18' when the germanium diffuses in the solid solution. The germanium-scavenging material and germanium will react to create finely dispersed intermetallic compounds. In this manner the germanium scavenging material reduces the concentration of germanium, thereby raising the melting point of the solid solution 32 while not adversely affecting the strength of the resultant bond 32.

The germanium-scavenging material can be a variety of materials, including but not limited to platinum, nickel and chromium. Of course, the scavenging materials will be made of various other compositions when the material to be scavenged is a material other than germanium (i.e. when tin or silicon are utilized in place of germanium).

The scavenging material may take the form of a discrete layer located between the second bonding layer 20 and anti-diffusion layer 14. Alternately, the scavenging material may be co-sputtered with the second bonding layer 20 (i.e. deposited at the same time as the second bonding layer to form numerous discrete layers or a gradient within the second bonding layer 20). The germanium scavenging material is preferably concentrated on the outer edges of the second bonding layer 20 (i.e. the edges of the second bonding layer 20 facing the anti-diffusion layer 14) so that germanium diffusing outwardly in the solid state is scavenged.

The scavenging material may also be a part or component of the adhesion layer 12 and/or anti-diffusion layer 14, or integrated into the adhesion layer 12 and/or anti-diffusion layer 14. For example, if the anti-diffusion layer 14 is platinum, that anti-diffusion layer 14 may also function as a germanium scavenging material. Alternately, the germanium scavenging material may be added to the adhesion layer 12 and/or anti-diffusion layer 14 as a separate material.

The use of the germanium-scavenging material allows some latitude in the strict thickness controls and allows for greater flexibility in the manufacturing process. In particular, it can be difficult and expensive to strictly control the thickness of the germanium layers 18, 18' and gold layers 20, 20'. For example, it can be difficult to limit the thickness of the initial germanium layers 18, 18' to 300 Angstroms, and the thickness of the initial gold layers 20, 20' to 30,000 Angstroms as in the example outlined above. The use of a germanium-scavenging material allows for some variance in the thickness controls, as extra germanium can be scavenged away.

The transient liquid phase bonding method described above preferably takes place at a temperature less than about 600° C., or further preferably less than about 500° C. Due to the relatively low eutectic temperature of gold/germanium eutectic 32 (as well as various other eutectic alloys), this bonding method can be utilized to bond components having relatively temperature-sensitive materials (i.e., such as aluminum bond pads, which have a melting point of about 660° C.) without damaging or melting such temperature-sensitive materials. The resultant bond has a melting temperature preferably greater than about 600° C., or more preferably greater than about 800° C., or most preferably greater than about 1000° C.

Thus the transient liquid joining process of the present invention allows the joining of two materials at a relatively low temperature and results in a bond having a relatively high melting temperature. The difference between the bonding temperature and the melting temperature of the resultant alloy is preferably at least about 400° C., or further preferably at least about 500° C., or most preferably at least about 640° C.

FIGS. 2 and 3 illustrate each of the substrates 10, 10' as having a layer of gold 20 and germanium 18 located thereon. However, if desired, one or both of the substrates 10, 10' may include only gold or only germanium. In this case, the relative thicknesses of the gold and germanium should be adjusted to provide for the desired composition of the resultant solid solution composition. Further, as noted above, gold/silicon or gold/tin eutectic combinations may be utilized as the materials of the bonding layers 16, 16'.

This bonding method can be used in bonding complete wafer surfaces (as shown in FIGS. 1-10) in a manner similar to glass frit bonding or oxide bonding. Each wafer or substrate 10 can be coated with the bonding layers 16, and heat can be applied under load until the heated bonding layers 16 merge and solidify. In addition, because the materials of the bonding layers 16 are preferably metallic, the resultant bond is electrically conductive which allows bonding to electronic elements such as bond pads, contacts, bond wires, etc.

Figure 11:
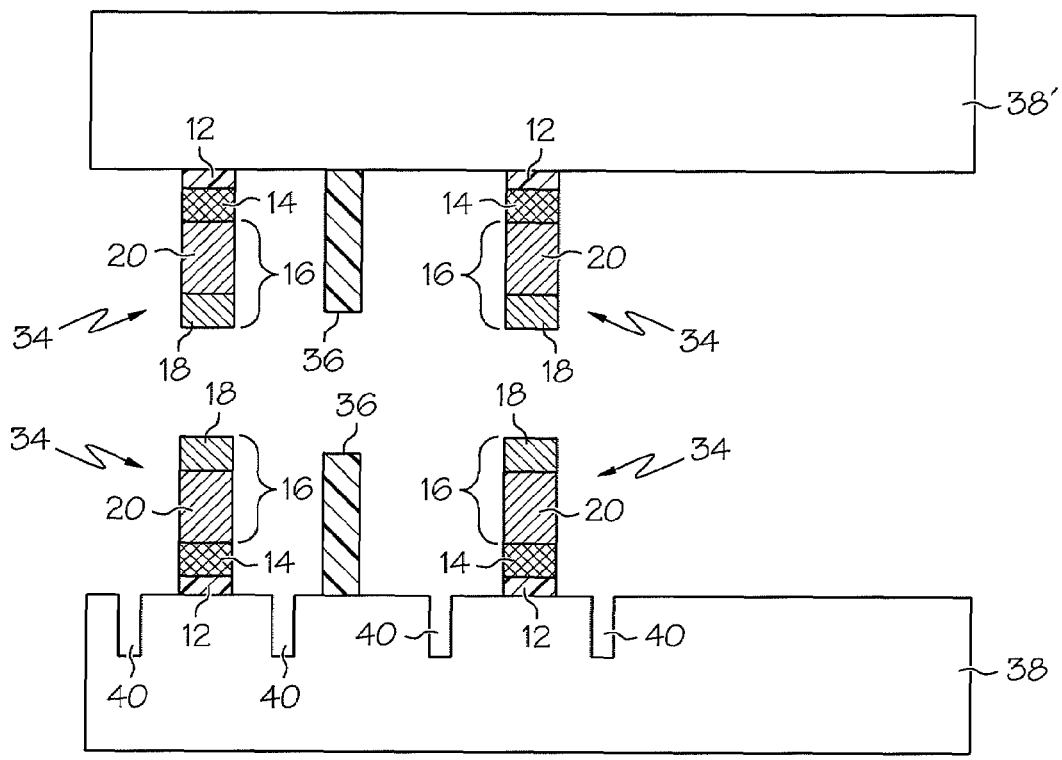
FIG. 11 is a side cross section of two components, with bond contacts, to be coupled together.

Rather than coating the entire surface of each substrate 10, 10' with the adhesion layer 12, diffusion barrier 14 and/or bonding layers 16, only selected portions of the substrate 10, 10' may be coated with the adhesion layer 12, diffusion barrier 14, and/or bonding layers 16. For example, FIG. 11 illustrates a pair of substrates 38, 38', with each substrate 38, 38' having a pair of bonding contacts 34 located thereon. Each bonding contact 34 includes an adhesion layer 12, a diffusion barrier 14 and a bonding layer 16. The bonding contacts 34 of the substrates 38, 38' have complementary sizes and shapes. In particular, the bonding contacts 34 are arranged such that when the substrate 38' is aligned with and located on top of the substrate 38, each of the bonding contacts 34 engage each other in the manner of a standard flip chip bonding process.

After the bonding contacts 34 engage and contact each other, the bonding layers 16 of each bonding contact 34 are then heated to initiate the transient liquid phase bonding outlined above, resulting in a solid solution 32 at each bonding contact 34 joining the substrates 38, 38' together. In addition, because each of the materials of the bonding contacts 34 are preferably electrically conductive, besides providing structural joining the bonding contacts 34 also allow for electrical interconnection between the substrates 38, 38'.

Each substrate 38, 38' may have a plurality of microstructures (not shown) located thereon, and the substrates 38, 38' may be joined as part of a batch fabrication process. After the substrates 38, 38' are joined, the joined substrates can be separated from each other, for example, by dicing through the thickness of the joined substrates 38, 38' to thereby singulate each microstructures from any other adjacent microstructures.

If desired, the spacing or gaps between the substrates 38, 38' can be controlled by locating spacers or standoffs 36 (made of, for example, silicon oxide or other material that does not melt at the bonding temperatures) between the two substrates 38, 38'. Upon liquification of the bonding layers 16, the substrates 38, 38' will move closer together until the standoffs 36 contact each other and remain in a solid state to maintain the desired spacing between the substrates 38, 38'.

The substrate 38 may include a plurality of containment wells 40 formed therein and located adjacent to the bonding contacts 34. The containment wells 40 are shaped and located such that any liquid run-off from the bonding contacts 34 (i.e. liquefied bonding materials 16) during the bonding process flow into the containment wells 40 to contain the run-off. If the liquid run-off were to spread, the run-off could react with or form solutions with the material of the substrate 38, with other bonding contacts 34, or with various other components located on the substrate 38. The containment wells 40 are preferably lined with a dielectric material (such as silicon dioxide) that is resistant to reacting with or forming solutions with the liquid run-off.

The use of germanium, tin, or silicon in combination with gold provides a relatively robust bond which has a high melting point. Thus the bonding method of the present invention can be used for conventional chip and wafer bonding, as well as any application which is desired to join two components together. The present invention allows joining at relatively low temperatures without the use of solder, fluxes or braze materials, and can be particularly useful where the bonded regions are inaccessible for adding solder or braze materials. The bonding method of the present invention does not require ultrasonic scrubbing in high heat which is required for conventional eutectic die bonding and may be damaging to the substrates.

Having described the invention in detail and by reference to the preferred embodiments, it will be apparent that modifications and variations thereof are possible without departing from the scope of the invention.

What is claimed is:

1. A method for bonding two components together comprising the steps of:
   providing a first component;
   providing a second component;
   locating a first eutectic bonding material between said first and second component, said first eutectic bonding material comprising at least one of germanium, tin, or silicon;
   locating a second eutectic bonding material between said first and second component and adjacent to said first eutectic bonding material, said second eutectic bonding material comprising gold, wherein the first and second bonding materials are provided as separate layers;
   after locating said first and second bonding materials, heating said first and second eutectic bonding materials to a temperature above a eutectic temperature of an alloy of said first and second eutectic bonding materials to allow a hypoeutectic alloy to form out of said first and second eutectic bonding materials; and
   forming a solid solution alloy from said hypoeutectic alloy, said solid solution alloy having a generally uniform composition and bonding said first and second components together.

2. The method of claim 1 wherein said first and second components both include a plurality of microstructures located thereon.

3. The method of claim 1 wherein said solid solution alloy has a melting temperature of at least about 361° C.

4. The method of claim 1 wherein said solid solution alloy has a melting temperature of at least about 450° C.

5. The method of claim 1 wherein said solid solution alloy has a melting temperature of at least about 1000° C.

6. The method of claim 1 wherein said solid solution alloy contains at least about 97 atomic percent gold.

7. The method of claim 1 wherein said heating step includes forming a liquid phase at a boundary of said first and second eutectic bonding materials, allowing said liquid phase to grow until substantially all of said first eutectic bonding material is in a liquid state, and allowing said first eutectic bonding material to completely diffuse into said second eutectic bonding material.

8. The method of claim 1 wherein said first and second bonding materials are provided in relative amounts to form a solid solution alloy.

9. The method of claim 1 wherein said first providing step includes providing said first component with a layer of said first and second eutectic bonding materials located thereon and wherein said second providing step includes providing said second component with a layer of said first and second eutectic bonding materials located thereon.

10. The method of claim 9 wherein said locating step includes locating said first and second components such that said first eutectic bonding materials of said first and second components are located adjacent to each other.

11. The method of claim 9 wherein said first providing step includes providing said first component with an adhesion layer and a diffusion-blocking layer located thereon and wherein said first and second eutectic bonding materials of said first component are located on said adhesion layer and said diffusion blocking layer of said first component, and wherein said second providing step includes providing said second component with an adhesion layer and a diffusion-blocking layer located thereon and wherein said first and second eutectic bonding materials of said second component are located on said adhesion layer and said diffusion blocking layer of said second component.

12. The method of claim 1 wherein said first eutectic bonding material is germanium and said second eutectic bonding material is gold, said eutectic temperature is about 361° C., said solid solution alloy has an atomic percentage of germanium of less than about 3% and has a melting temperature of greater than about 450° C.

13. The method of claim 12 wherein said heating step includes heating said first and second eutectic bonding materials to a temperature of at least about 500° C.

14. The method of claim 1 wherein said first and second components are silicon wafers or portions of silicon wafers.

15. The method of claim 1 wherein at least one of said first and second components is a ceramic material.

16. The method of claim 1 wherein said second eutectic bonding material includes a scavenging material which reacts with said first eutectic bonding material and reduces the concentration of said first eutectic bonding material during at least one of said heating step or said step of forming a solid solution alloy.

17. The method of claim 16 wherein said scavenging material is nickel, platinum, or chromium.

18. The method of claim 1 wherein said hypoeutectic alloy has a melting temperature that is at least about 400° C. greater than said temperature to which said first and second eutectic bonding materials are heated during said heating step.

19. A method for bonding two components together comprising the steps of:
   providing a first component;
   providing a second component;
   locating a first and a second eutectic bonding material between said first and second components, wherein the first and second bonding materials are provided as separate layers;

after locating said first and second bonding materials, heating said first and second eutectic bonding materials to a temperature less than about 500° C. to allow a hypoeutectic alloy to form out of said first and second eutectic bonding materials; and forming a solid solution alloy from said hypoeutectic alloy, said solid solution alloy bonding said first and second components together in the manner of transient liquid phase eutectic bonding, wherein said solid solution alloy has a generally uniform composition and a melting temperature of greater than about 500° C.

20. The method of claim 19 wherein said first eutectic bonding material is at least one of germanium, tin or silicon, and wherein said second eutectic bonding material is gold.

21. The method of claim 19 wherein said solid solution alloy has at least about 97 atomic percent gold.

22. The method of claim 19 wherein said heating step includes forming a liquid phase at a boundary of said first and second eutectic bonding materials, allowing said liquid phase to grow until substantially all of said first eutectic bonding material is in a liquid state, and allowing said first eutectic bonding material to completely diffuse into said second eutectic bonding material.

23. The method of claim 19 wherein said first and second components are ceramics, silicon wafers or portions of silicon wafers.

24. The method of claim 19 wherein said hypoeutectic alloy has a melting temperature that is at least about 400° C. greater than said temperature to which said first and second eutectic bonding materials are heated during said heating step.

25. A method for bonding two components together comprising the steps of:
providing a first component;
providing a second component;
locating a first and a second eutectic bonding material between said first and second components, wherein the first and second bonding materials are provided as separate layers;
after locating said first and second bonding materials, heating said first and second eutectic bonding materials to an elevated temperature to allow a hypoeutectic alloy to form out of said first and second eutectic bonding materials; and forming a generally uniform solid solution from said hypoeutectic alloy, said solid solution alloy bonding said first and second components together, wherein said solid solution alloy has a melting temperature that is at least about 400° C. greater than said elevated temperature.

26. The method of claim 25 wherein said solid solution alloy has a melting temperature that is at least about 500° C. greater than said elevated temperature.

27. The method of claim 25 wherein said solid solution alloy has a melting temperature that is at least about 640° C. greater than said elevated temperature.

28. The method of claim 25 wherein said heating step and said step of forming a solid solution are carried out in the manner of transient liquid phase bonding.

29. The method of claim 1 wherein at least one of said first or second components includes a spacer located thereon, and wherein the method further includes the step of applying compressive pressure to urge said first and second components toward each other, and wherein said spacer limits the movement of said first and second components toward each other when said compressive pressure is applied.

30. The method of claim 1 wherein at least one of said first or second components includes at least one containment well formed therein, and wherein the method includes allowing a liquid form of at least one of said first or second eutectic bonding materials to flow into said at least one containment well.

31. The method of claim 19 wherein at least one of said first or second components includes a spacer located thereon, and wherein the method further includes the step of applying compressive pressure to urge said first and second components toward each other, and wherein said spacer limits the movement of said first and second components toward each other when said compressive pressure is applied.

32. The method of claim 25 wherein at least one of said first or second components includes a spacer located thereon, and wherein the method further includes the step of applying compressive pressure to urge said first and second components toward each other, and wherein said spacer limits the movement of said first and second components toward each other when said compressive pressure is applied.

* * * * *

UNITED STATES PATENT AND TRADEMARK OFFICE
CERTIFICATE OF CORRECTION

PATENT NO. : 7,628,309 B1  
APPLICATION NO. : 11/120879  
DATED : December 8, 2009  
INVENTOR(S) : Eriksen et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 874 days.

Signed and Sealed this

Second Day of November, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,628,309 B1 | Page 1 of 1 |
| APPLICATION NO. | : 11/120879 | |
| DATED | : December 8, 2009 | |
| INVENTOR(S) | : Odd Harald Steen Eriksen, Shuwen Guo and Kimiko Childress | |

It is certified that error appears in the above-identified patent and that said Letters Patent is hereby corrected as shown below:

Claim 13, line 41, "claim 12" should read --claim 11--.

Signed and Sealed this
Twenty-eighth Day of December, 2010

David J. Kappos
*Director of the United States Patent and Trademark Office*